United States Patent
Lin et al.

(10) Patent No.: US 7,586,340 B2
(45) Date of Patent: Sep. 8, 2009

(54) DRIVING APPARATUS HAVING AN ADJUSTABLE DRIVING CURRENT OUTPUT

(75) Inventors: Kai-Ping Lin, Hsinchu (TW); Kai-Chi Lin, Hsinchu (TW); Tsung-Jen Lin, Hsinchu (TW)

(73) Assignee: Fitipower Integrated Technology, Inc., Hsinchu (TW)

(*) Notice: Subject to any disclaimer, the term of this patent is extended or adjusted under 35 U.S.C. 154(b) by 0 days.

(21) Appl. No.: 11/733,165

(22) Filed: Apr. 9, 2007

(65) Prior Publication Data

US 2008/0100349 A1 May 1, 2008

(30) Foreign Application Priority Data

Oct. 27, 2006 (TW) .............................. 95139788 A

(51) Int. Cl.
H03B 1/00 (2006.01)
H03K 3/00 (2006.01)

(52) U.S. Cl. .................. 327/108; 327/538; 326/80

(58) Field of Classification Search ......... 327/108–112, 327/538–543; 326/80–81
See application file for complete search history.

(56) References Cited

U.S. PATENT DOCUMENTS

| | | | | | |
|---|---|---|---|---|---|
| 4,453,115 | A | * | 6/1984 | Yoshida | 318/434 |
| 5,278,492 | A | * | 1/1994 | Huynh et al. | 323/326 |
| 5,384,516 | A | * | 1/1995 | Kawabata et al. | 315/160 |
| 5,589,790 | A | * | 12/1996 | Allen | 327/333 |
| 5,590,033 | A | * | 12/1996 | Kawano | 363/25 |
| 5,721,714 | A | * | 2/1998 | Lewis | 369/13.22 |
| 7,034,600 | B2 | * | 4/2006 | Scheikl | 327/376 |
| 7,038,529 | B2 | * | 5/2006 | Ozeki et al. | 327/538 |
| 7,075,355 | B2 | * | 7/2006 | Furuie et al. | 327/434 |
| 7,102,395 | B2 | * | 9/2006 | Saito | 327/74 |
| 7,102,425 | B2 | * | 9/2006 | Lee | 327/589 |
| 7,157,959 | B2 | * | 1/2007 | Ball et al. | 327/427 |
| 7,173,406 | B2 | * | 2/2007 | Rategh | 323/314 |
| 7,176,753 | B2 | * | 2/2007 | Noda et al. | 327/543 |
| 7,180,279 | B2 | * | 2/2007 | Novak | 323/283 |
| 7,183,817 | B2 | * | 2/2007 | Sanchez et al. | 327/112 |
| 7,193,403 | B2 | * | 3/2007 | Sudoh et al. | 323/313 |
| 7,196,572 | B2 | * | 3/2007 | Schneider et al. | 327/538 |
| 7,199,647 | B2 | * | 4/2007 | Tanizawa | 327/543 |
| 7,332,871 | B2 | * | 2/2008 | Lu | 315/247 |
| 2003/0192881 | A1 | * | 10/2003 | Bassill et al. | 219/626 |
| 2005/0258887 | A1 | * | 11/2005 | Ito et al. | 327/333 |
| 2006/0132195 | A1 | * | 6/2006 | Kim et al. | 327/108 |
| 2006/0164134 | A1 | * | 7/2006 | Uno | 327/112 |
| 2006/0164135 | A1 | * | 7/2006 | Myono et al. | 327/112 |
| 2006/0186934 | A1 | * | 8/2006 | Nishimura | 327/108 |

(Continued)

Primary Examiner—Lincoln Donovan
Assistant Examiner—Adam D Houston
(74) Attorney, Agent, or Firm—Raymond J. Chew

(57) ABSTRACT

An exemplary driving apparatus capable of generating a driving current, including: an analog input generating circuit, an analog input driving circuit, and an output circuit. The analog input generating circuit is electrically connected between a first voltage source and the ground and configured (i.e., structured and arranged) for supplying an adjustable analog signal. The analog input driving circuit is electrically connected between a second voltage source and the ground and configured for converting the analog signal into a pulsed signal. The output circuit is configured for converting the pulsed signal into a driving current as an output. The frequency of the pulsed signal can be adjusted via adjusting the analog signal and thereby varying the driving current. Thus the driving current can be adapted for the different target loads.

16 Claims, 8 Drawing Sheets

U.S. PATENT DOCUMENTS

| | | | |
|---|---|---|---|
| 2006/0197561 A1* | 9/2006 | Lee et al. | 327/131 |
| 2006/0202737 A1* | 9/2006 | Walter | 327/427 |
| 2006/0214702 A1* | 9/2006 | Lee | 327/108 |
| 2006/0232307 A1* | 10/2006 | Kanno et al. | 327/112 |
| 2006/0290390 A1* | 12/2006 | Jang et al. | 327/112 |
| 2007/0001717 A1* | 1/2007 | Matsumoto et al. | 327/112 |
| 2007/0007902 A1* | 1/2007 | Lu | 315/209 R |
| 2007/0040603 A1* | 2/2007 | Shor et al. | 327/543 |
| 2007/0046331 A1* | 3/2007 | Kwon et al. | 326/83 |
| 2007/0052454 A1* | 3/2007 | Gose et al. | 327/108 |
| 2007/0057701 A1* | 3/2007 | Abdelatty Ali | 327/108 |
| 2007/0057704 A1* | 3/2007 | Yokoo | 327/112 |
| 2007/0057716 A1* | 3/2007 | Pan et al. | 327/539 |
| 2007/0217093 A1* | 9/2007 | Xue et al. | 361/18 |
| 2008/0105054 A1* | 5/2008 | Kanai et al. | 73/514.29 |

* cited by examiner

DRIVING APPARATUS HAVING AN ADJUSTABLE DRIVING CURRENT OUTPUT

BACKGROUND

1. Technical Field

The present invention generally relates to a driving apparatus, and more particularly to a driving apparatus that could achieve an adjustable driving current output.

2. Description of Related Art

Electronic loads have two types of driving modes, one is current driving mode and the other one is voltage driving mode. For different electronic loads, such as electrical motors, light emitting diodes (LEDs), liquid crystal displays (LCDs), etc., stable and adjustable driving voltages/currents circuits are needed.

Referring to FIG. 8, a driving apparatus 100 configured for supplying a driving current to a target load 101 is provided. The driving apparatus 100 includes a rectifier 110, a microprogrammed control unit (MCU) 120, a digital input driving circuit 130, and an output circuit 140. The rectifier 110 converts a high voltage alternating current (AC) voltage $V_{ac}$ to a high voltage direct current (DC) voltage $V_{dc}$. The high voltage DC voltage $V_{dc}$ can be used as power supply to the digital input driving circuit 130 and the target load 101. A DC voltage $V_{dc1}$ as a power source to the MCU 120. The MCU 120 generates/produces a pulse width modulation (PWM) signal. The digital input driving circuit 130 modulates the PWM signal to generate an output signal $V_g$. The output circuit 140 receives the output signal $V_g$ and then generates a driving current $I_c$ with a level in conjunction with that of the output signal $V_g$. Finally, the driving current $I_c$ generated by the output circuit 140 can be inputted into the target load 101 for driving the target load 101. Even further, the digital input driving circuit 130 could also generate a stable and constant driving voltage $V_{out}$ used to drive other loads.

However, because the PWM signal is controlled by embedded software or firmware and is generally preprogrammed by the manufacturer, the PWM signal is non-adjustable, so the output signal $V_g$ cannot be varied correspondingly, which results in electrical parameters of the driving current $I_c$ generated by the driving apparatus 100 could not be adjusted. As such, the above-mentioned driving apparatus 100 is difficult to meet the different driving currents requirements for different target loads.

What is needed, therefore, is a driving apparatus could achieve an adjustable driving current output.

SUMMARY

A driving apparatus capable of generating an adjustable driving current, including: an analog input generating circuit, an analog input driving circuit, and an output circuit. The analog input generating circuit is electrically connected between a first voltage source and the ground and configured (i.e., structured and arranged) for providing/supplying an adjustable analog signal. The analog input driving circuit is electrically connected between a second voltage source and the ground and configured for converting the analog signal into a pulsed signal. The output circuit is configured for converting the pulsed signal into a driving current as an output. The frequency of the pulsed signal can be adjusted via adjusting the analog signal, and thereby varying the driving current.

Other advantages and novel features will become more apparent from the following detailed description of the present driving apparatus, when taken in conjunction with the accompanying drawings.

BRIEF DESCRIPTION OF THE DRAWINGS

Many aspects of the present driving apparatus can be better understood with reference to the following drawings. The components in the drawings are not necessarily drawn to scale, the emphasis instead being placed upon clearly illustrating the principles of the present driving apparatus.

Figure 1:
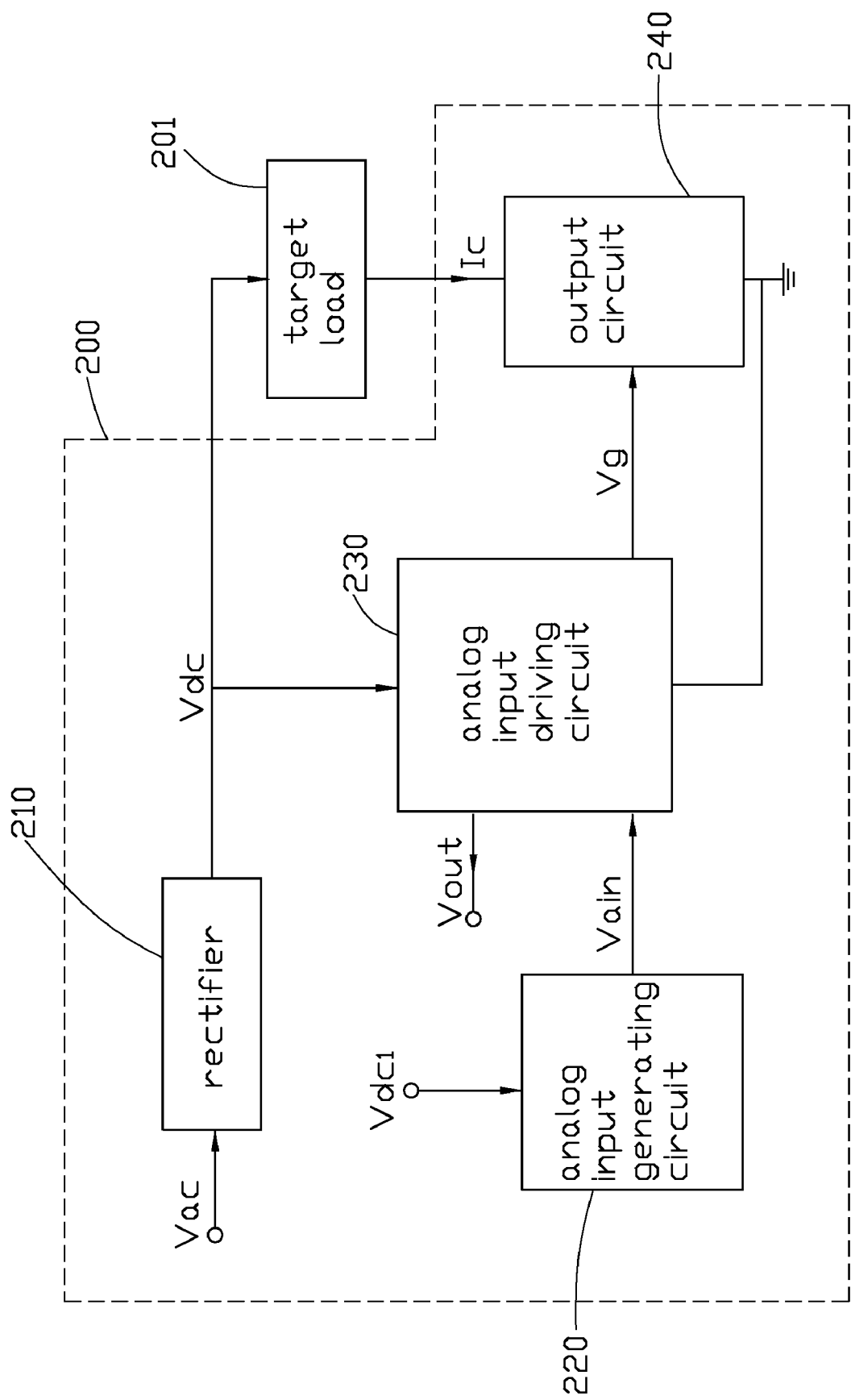
FIG. 1 is a schematic view of a driving apparatus in accordance with a preferred embodiment.

Corresponding reference characters indicate corresponding parts throughout the drawings. The exemplifications set out herein illustrate at least one preferred embodiment of the present driving apparatus, in one form, and such exemplifications are not to be construed as limiting the scope of the driving apparatus in any manner.

DETAILED DESCRIPTION OF THE INVENTION

Reference will now be made to the drawings to describe at least one preferred embodiment of the present driving apparatus.

Referring to FIG. 1, a driving apparatus 200, in accordance with a preferred embodiment, is shown. The driving apparatus 200 includes: a rectifier 210, an analog input generating circuit 220, an analog input driving circuit 230, and an output circuit 240.

Figure 2:
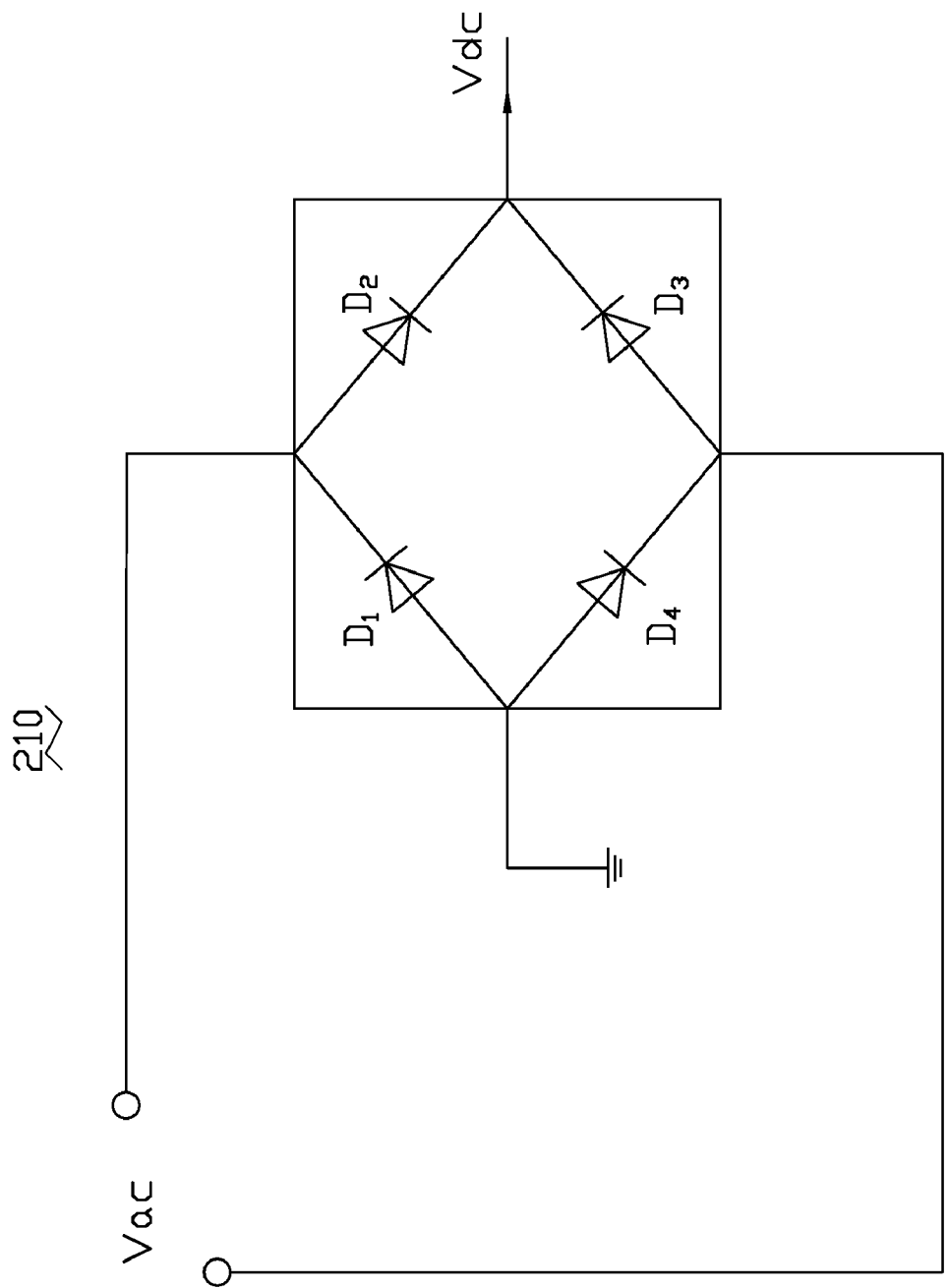
FIG. 2 is a diagram showing a circuit configuration for the rectifier of FIG. 1.

Referring to FIG. 1 and FIG. 2, the rectifier 210 is configured for converting a AC voltage $V_{ac}$ into a DC voltage $V_{dc}$. The DC voltage $V_{dc}$ can be connected with a power input terminal of the analog input driving circuit 230 and also can be voltage source for the target load 201. In the illustrated embodiment, the rectifier 210 is a full-wave rectifier, and this full-wave rectifier includes four diodes $D_1$, $D_2$, $D_3$, $D_4$ electrically connected together in a well-known manner.

Figure 3:
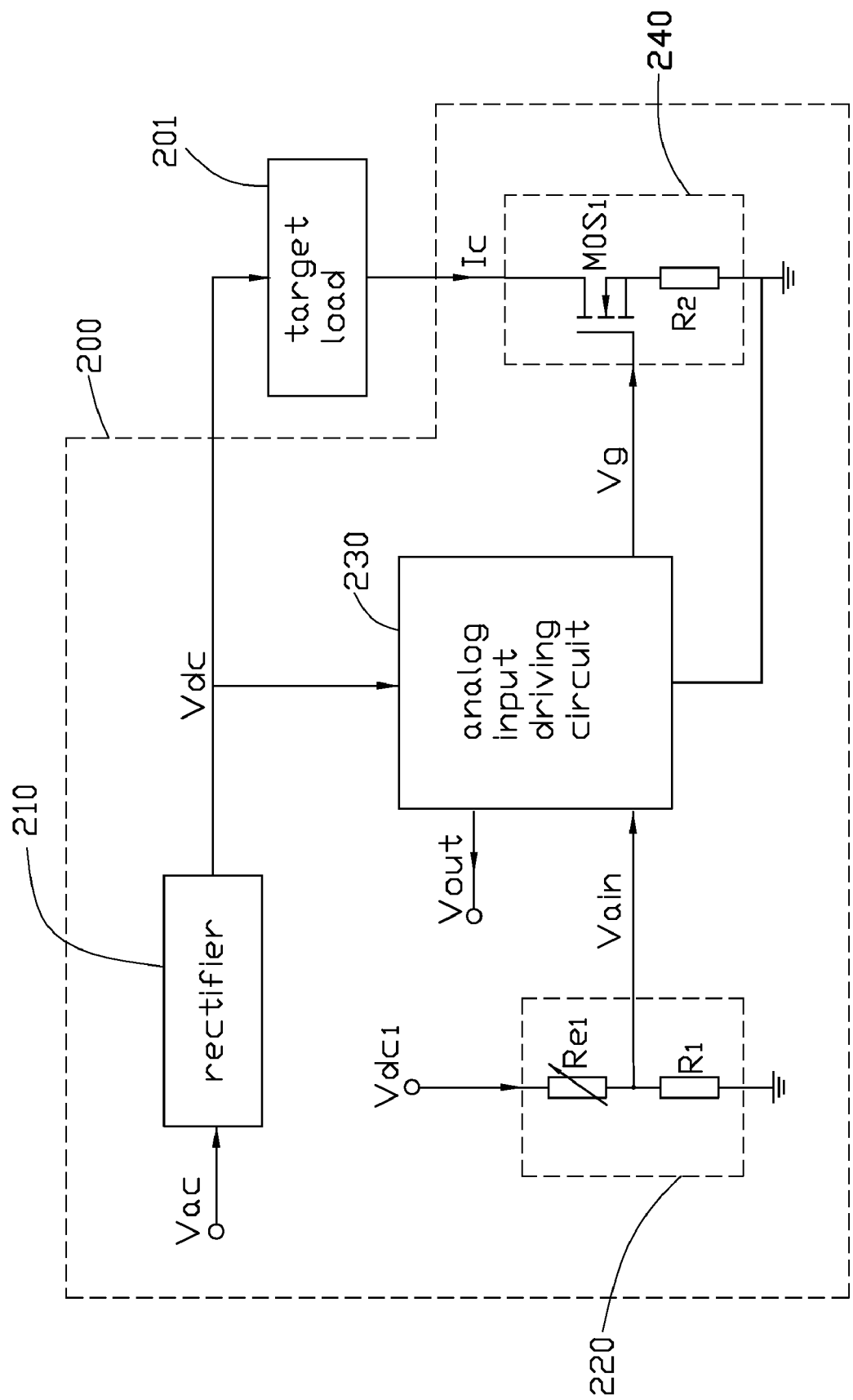
FIG. 3 is a more detailed schematic view of the driving apparatus of FIG. 1.

Referring to FIG. 1 with FIG. 3 together, the analog input generating circuit 220 is configured for providing/supplying an adjustable analog signal $V_{ain}$ to the analog input driving circuit 230. In the illustrated embodiment, the analog input generating circuit 220 includes a resistor $R_1$ and a variable resistor $R_{e1}$ together connected between a DC voltage $V_{dc1}$ and the ground. In particular, the resistor $R_1$ is electrically connected with the variable resistor $R_{e1}$ together, in series, at a node; and an input end/terminal for the analog signal $V_{ain}$ of the analog input driving circuit 230 is connected to the node. As such, the analog signal $V_{ain}$ can be varied via adjusting the value of the variable resistor $R_{e1}$.

The analog input driving circuit 230 is configured for converting the analog signal $V_{ain}$ into a pulsed signal $V_g$. The pulsed signal $V_g$ will be supplied to the output circuit 240. The frequency of the pulsed signal $V_g$ varies in conjunction with the analog signal $V_{ain}$.

The output circuit 240 is configured for converting the pulsed signal $V_g$ into a driving current $I_c$ as an output. The driving current $I_c$ can be outputted into a target load 201 for driving the target load 201. A pulse generation frequency of the pulsed signal $V_g$ can be varied via adjusting the analog signal $V_{ain}$ and thereby indirectly adjusting the driving current $I_c$. Thus the driving current $I_c$ can be adapted for the target load 201. In the illustrated embodiment, the output circuit 240 includes a metal oxide semiconductor field effect transistor (MOSFET) $MOS_1$ and a current-limiting resistor $R_2$. The $MOS_1$ gate is configured for receiving the pulsed signal $V_g$, the current-limiting resistor $R_2$ is provided between the $MOS_1$ source and the ground, the $MOS_1$ drain acts as an output terminal of the driving current $I_c$. Accordingly, the $MOS_1$ gate receives the pulsed signal $V_g$ with an adjustable pulse generation frequency, and the driving current $I_c$ being generated at the $MOS_1$ drain can be adjusted by the variation of the pulse generation frequency of the pulsed signal $V_g$ to meet the requirements of the target load 201.

Figure 4:
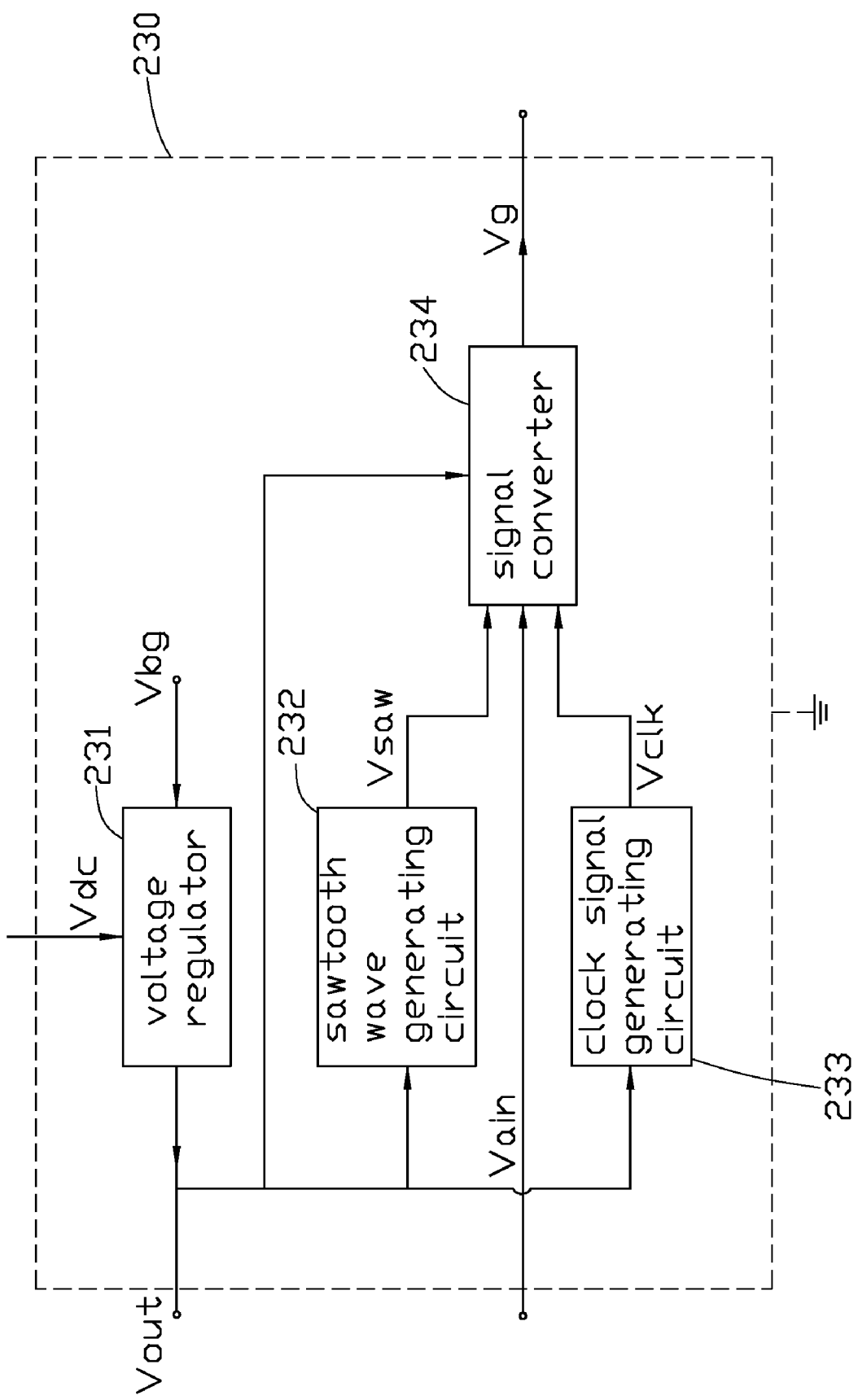
FIG. 4 is a schematic view of the analog input driving circuit of FIG. 1.

Referring to FIG. 4, the analog input driving circuit 230 includes a voltage regulator 231, a sawtooth wave generating circuit 232, a clock signal generating circuit 233, and a signal converter 234. The sawtooth wave generating circuit 232 is used to generate a sawtooth wave signal $V_{saw}$. The clock signal generating circuit 233 is used to generate a clock signal $V_{clk}$.

In particular, the voltage regulator 231 receives the DC voltage $V_{dc}$ generated from the rectifier 210 and a reference voltage $V_{bg}$ can be generated from a band gap circuit (not shown), and the voltage regulator 231 is configured to transform the DC voltage $V_{dc}$ to another DC voltage $V_{out}$ with a predetermined level and then provide the DC voltage $V_{out}$ into the sawtooth wave generating circuit 232, the clock signal generating circuit 233, and the signal converter 234. In addition, the DC voltage $V_{out}$ also can be provided to other loads as DC voltage supply thereof.

The signal converter 234 is configured for receiving the sawtooth wave signal $V_{saw}$ from the sawtooth wave generating circuit 232, the analog signal $V_{ain}$ from the analog input generating circuit 220 and the clock signal $V_{clk}$ from the clock signal generating circuit 233, and thereby processing the sawtooth wave signal $V_{saw}$, the analog signal $V_{ain}$ and the clock signal $V_{clk}$ into be the pulsed signal $V_g$ as an output.

Figure 5:
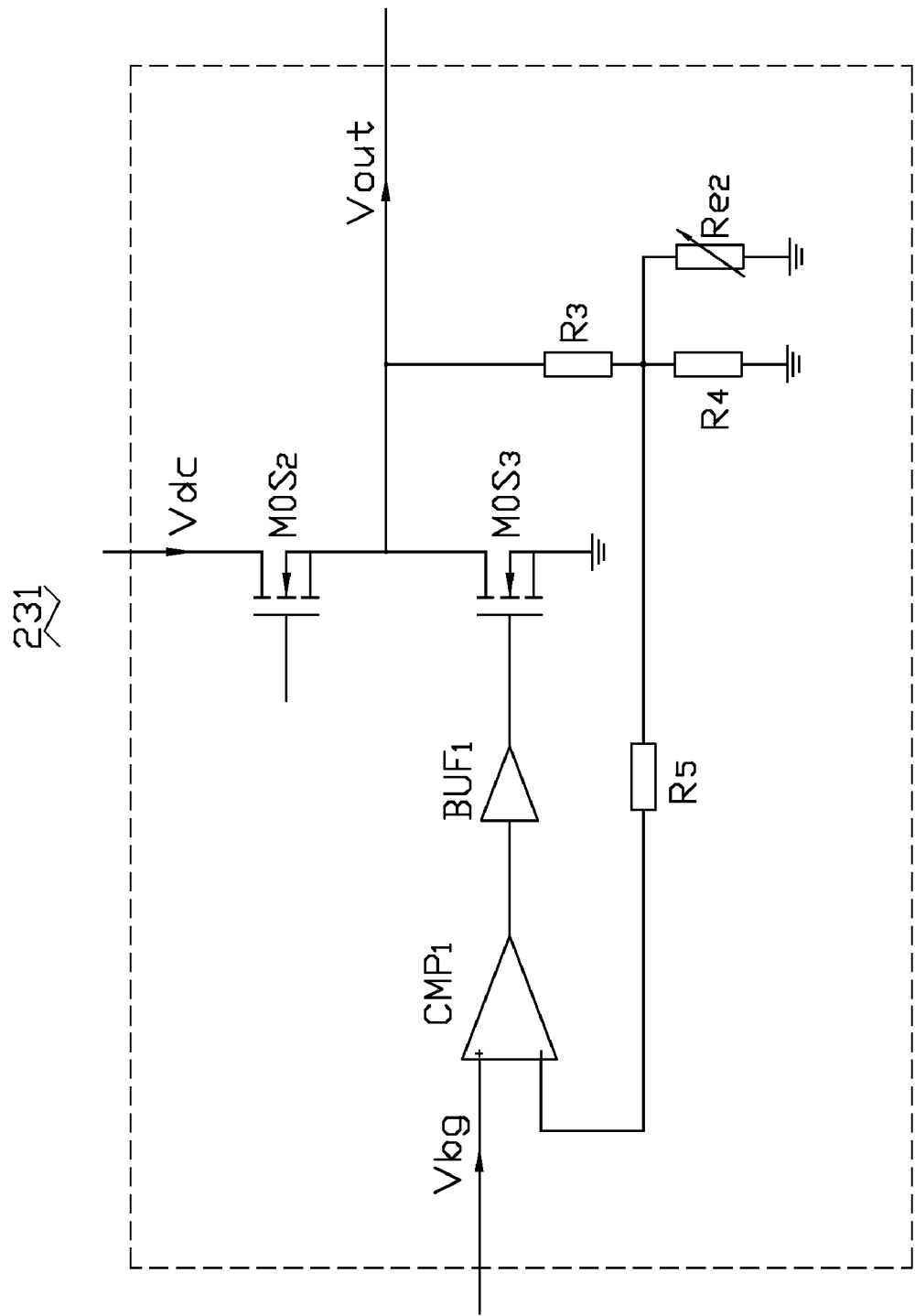
FIG. 5 is a diagram showing a circuit configuration for the voltage regulator of FIG. 4.

Referring to FIG. 5, the voltage regulator 231 includes a relative high voltage MOSFET $MOS_2$, a relative low voltage MOSFET $MOS_3$, a first voltage-dividing resistor $R_3$, a second voltage-dividing resistor $R_4$, a feedback resistor $R_5$, a comparator $CMP_1$, a buffer $BUF_1$, and an adjustable resistor $R_{e2}$.

The MOSFETs $MOS_2$ and the $MOS_3$ are provided between the DC voltage $V_{dc}$ and the ground. The first voltage-dividing resistor $R_3$ and the second voltage-dividing resistor $R_4$ are electrically connected, in series, to a node formed between the MOSFET $MOS_2$ source and the MOSFET $MOS_3$ drain. The MOSFET $MOS_2$ drain is configured to receive the DC voltage $V_{dc}$, the node formed between the MOSFET $MOS_2$ source and the MOSFET $MOS_3$ drain acts as the output terminal of the DC voltage $V_{out}$, the MOSFET $MOS_3$ source is connected to the ground, and the MOSFET $MOS_3$ gate is connected to an output terminal of the buffer $BUF_1$.

The comparator $CMP_1$ includes a negative input terminal, a positive input terminal, and an output terminal. The positive input terminal of the comparator $CMP_1$ is configured to receive the reference voltage $V_{bg}$; the output terminal is connected to an input terminal of the buffer $BUF_1$.

One terminal of the feedback resistor $R_5$ is connected to the negative input terminal of the comparator $CMP_1$, the other terminal of the feedback resistor $R_5$ is connected to a node formed between the first voltage-dividing resistor $R_3$ and the second voltage-dividing resistor $R_4$.

One terminal of the adjustable resistor $R_{e2}$ is connected to the node formed between the first voltage-dividing resistor $R_3$ and the second voltage-dividing resistor $R_4$; the other terminal of the adjustable resistor $R_{e2}$ is connected to the ground. As such, the DC voltage $V_{out}$ is controllable due to the adjustable resistor $R_{e2}$.

Figure 6:
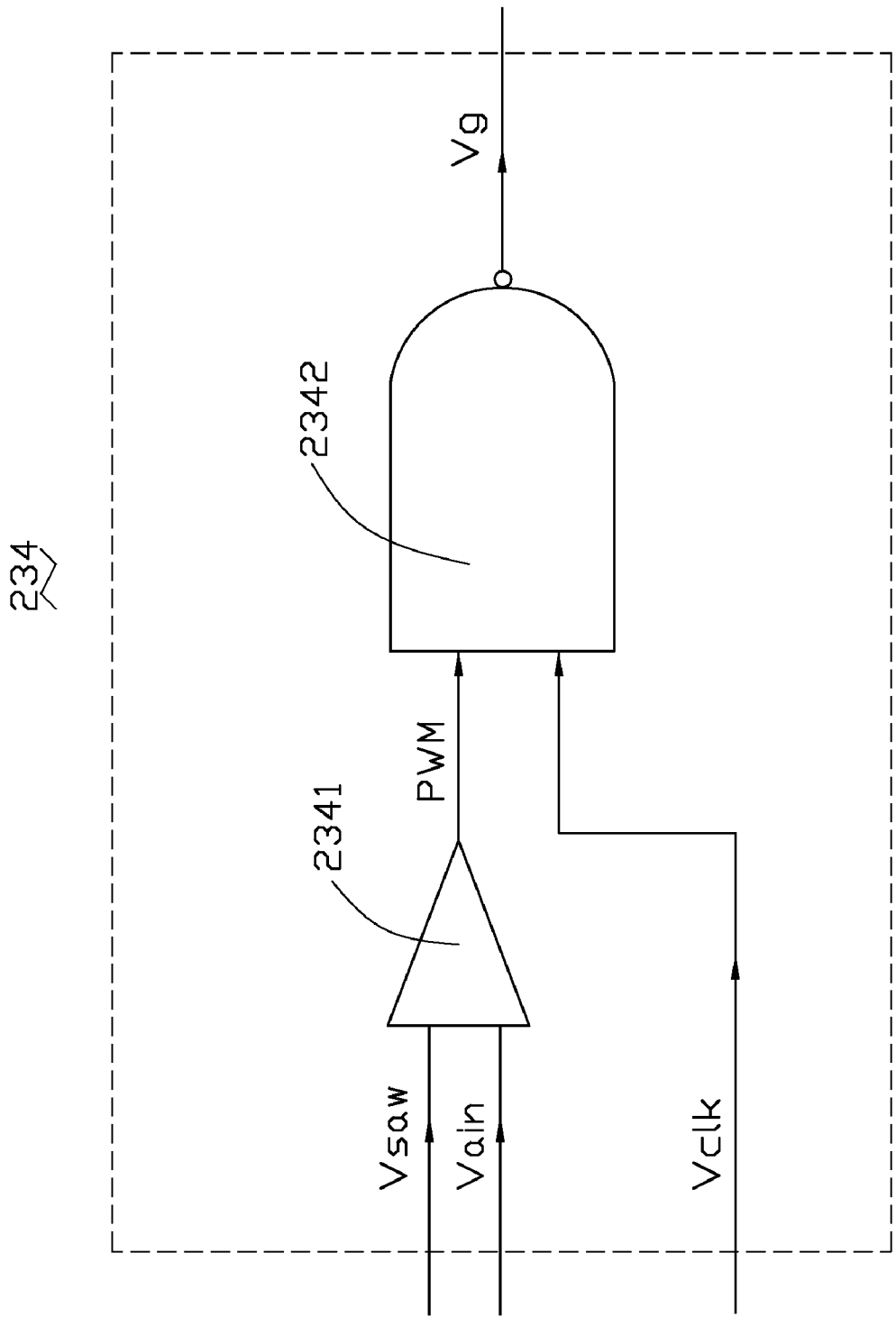
FIG. 6 is a schematic view of the signal converter of FIG. 4.

Referring to FIG. 6, the signal converter 234 includes a first level converter 2341 and a second level converter 2342. The first level converter 2341 is configured to receive the analog signal $V_{ain}$ and the sawtooth wave signal $V_{saw}$, and then process the analog signal $V_{ain}$ and the sawtooth wave signal $V_{saw}$ into a pulse width modulation (PWM) wave signal. The PWM wave signal will be provided into the second level converter 2342. The second level converter 2342 is configured to receive the PWM wave signal and the clock signal $V_{clk}$, and then process the PWM wave signal and the clock signal $V_{clk}$ into a pulsed signal $V_g$. As an illustrated purpose, the first level converter 2341 is a comparison circuit, and the second level converter 2342 is a NAND gate.

Figure 7:
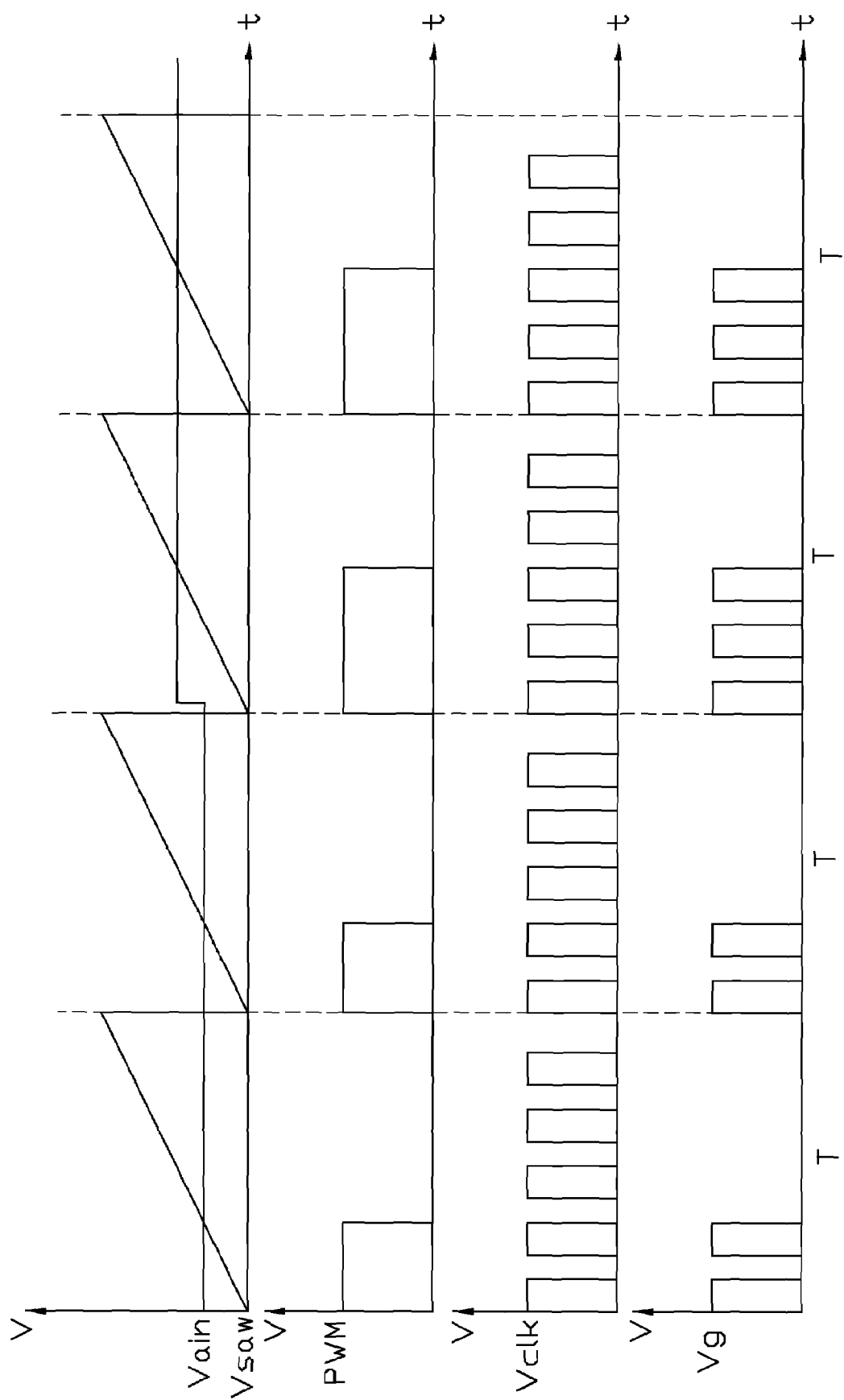
FIG. 7 is a diagram showing the relationship between time vs. amplitude for five signals in the signal converter of FIG. 6.
Figure 8:
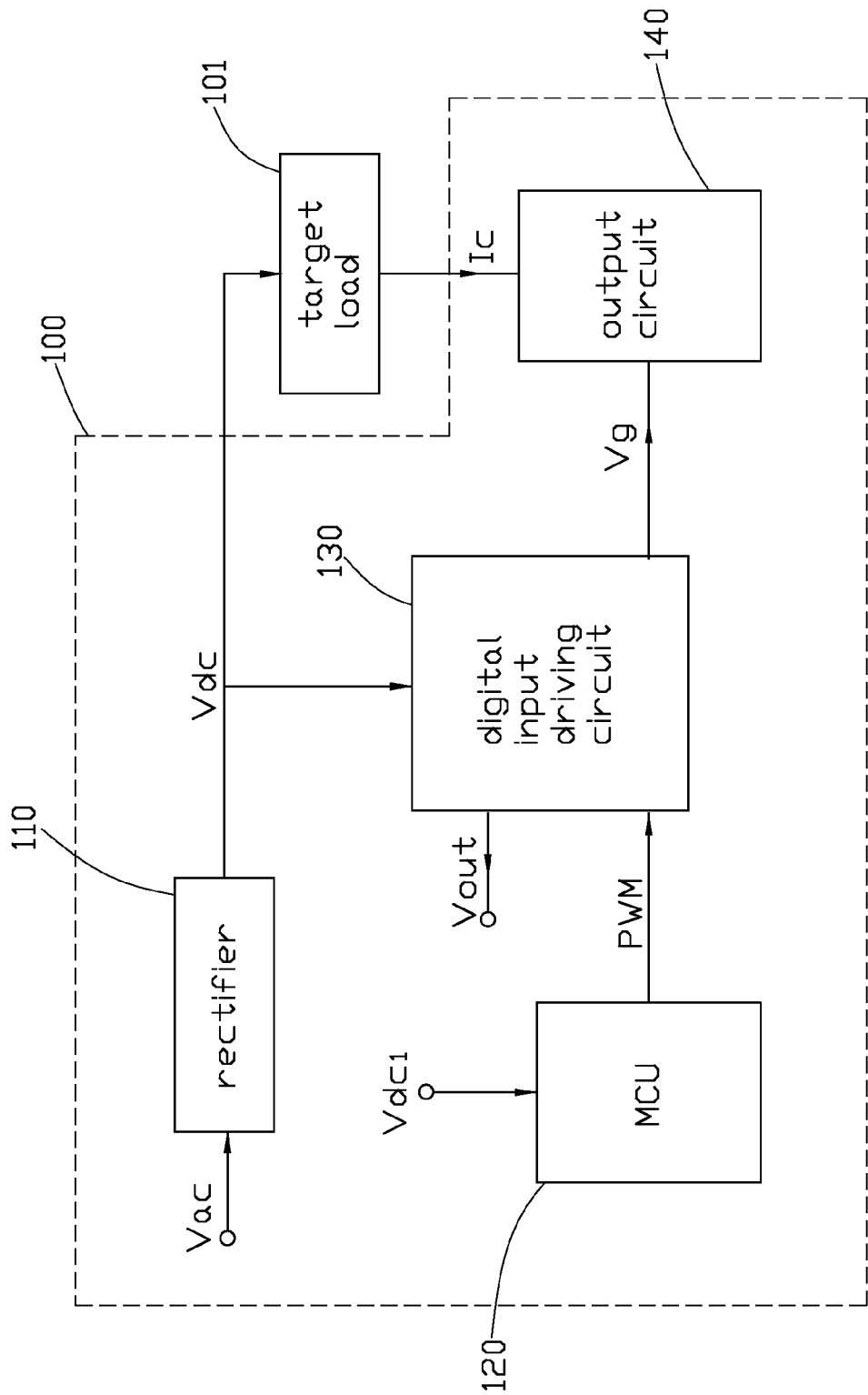
FIG. 8 is a schematic view of a conventional driving apparatus.

FIG. 7 shows the relationship between time vs. amplitude for five signals in the signal converter 234. A duty-cycle of the PWM wave signal is varied with the variation of the amplitude of the analog signal $V_{ain}$, and thereby the pulse generation frequency of the pulsed signal $V_g$ is varied correspondingly. As shown in FIG. 7, if a high level of analog signal $V_{ain}$ is higher than a high level of the sawtooth wave signal $V_{saw}$, the PWM wave will not be influenced by the sawtooth wave signal $V_{saw}$. Correspondingly, the driving current $I_c$ generated from the driving apparatus 200 will not be influenced by the sawtooth wave $V_{saw}$ at the time when the high level of analog signal $V_{ain}$ is higher than the high level of the sawtooth wave signal $V_{saw}$.

Therefore, the driving current $I_c$ can be adjusted by modulating the pulse generation frequency of the pulsed signal $V_g$, and the pulse generation frequency of the pulsed signal $V_g$ can be varied by adjusting the analog signal $V_{ain}$ based upon the change of the value of the variable resistor $R_{e1}$, so the driving apparatus 200 can output an adjustable driving current $I_c$ to meet the different driving currents requirements for different target loads.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A driving apparatus configured for generating an adjustable driving current, comprising:
    an analog input generating circuit;
    an analog input driving circuit; and
    an output circuit;
    wherein the analog input generating circuit is electrically connected between a first voltage source and ground, and configured for providing an adjustable analog signal;
    the analog input driving circuit is electrically connected between a second voltage source and ground, and configured for converting the analog signal into a pulsed signal;
    the output circuit is configured for converting the pulsed signal into a driving current as an output, and the frequency of the pulsed signal can be adjusted via adjusting the analog signal and thereby varying the driving current;

the second voltage source comprises a rectifier, the rectifier being configured for converting an alternating current (AC) voltage into a direct current (DC) voltage; and wherein the analog input generating circuit comprises a resistor $R_1$ and a variable resistor $R_{e1}$ together connected between the first voltage source and ground, the resistor $R_1$ is electrically connected to the variable resistor $R_{e1}$ together, in series, at a node, and the adjustable analog signal is supplied to the analog input driving circuit from the node.

2. The driving apparatus of claim 1, wherein the rectifier is a full-wave rectifier.

3. The driving apparatus of claim 1, wherein the analog input driving circuit comprises a voltage regulator, a sawtooth wave generating circuit, a clock signal generating circuit, and a signal converter; the sawtooth wave generating circuit being configured for generating a sawtooth wave signal; the clock signal generating circuit being configured for generating a clock signal; the voltage regulator being configured for converting the DC voltage provided by the second voltage source into another DC voltage with a predetermined level and then providing the another DC voltage to the sawtooth wave generating circuit, the clock signal generating circuit and the signal converter; the signal converter being configured for processing the sawtooth wave signal, the adjustable analog signal and the clock signal into the pulsed signal as an output.

4. The driving apparatus of claim 3, wherein the voltage regulator comprises a first metal oxide semiconductor field effect transistor (MOSFET), a second MOSFET, a first voltage-dividing resistor, a second voltage-dividing resistor, a feedback resistor, a comparator, a buffer, and an adjustable resistor; the first MOSFET and the second MOSFET being provided between the second voltage source and ground; the first voltage-dividing resistor and the second voltage-dividing resistor being electrically connected, in series, to a node formed between the first MOSFET source and the second MOSFET drain, and the node acting as an output terminal of the another DC voltage; the first MOSFET drain being configured to receive the DC voltage provided by the second voltage source; the second MOSFET source being connected to ground, and the second MOSFET gate being connected to an output terminal of the buffer; the comparator comprising a negative input terminal, a positive input terminal and an output terminal, the positive input terminal being configured to receive a reference voltage, the output terminal being connected to an input terminal of the buffer; one terminal of the feedback resistor being connected to the negative input terminal of the comparator, and the other terminal of the feedback resistor being connected to a node formed between the first voltage-dividing resistor and the second voltage-dividing resistor; and one terminal of the adjusting resistor being connected to the node formed between the first voltage-dividing resistor and the second voltage-dividing resistor, and the other terminal of the adjustable resistor being connected to ground.

5. The driving apparatus of claim 3, wherein the signal converter comprises a first level converter and a second level converter; the first level converter being configured to receive the adjustable analog signal and the sawtooth wave signal, and process the adjustable analog signal and the sawtooth wave signal into a pulse width modulation (PWM) wave signal; and the second level converter being configured to receive the PWM wave signal and the clock signal, and then process the PWM wave signal and the clock signal into the pulsed signal.

6. The driving apparatus of claim 5, wherein the first level converter is a comparison circuit, and the second level converter is a NAND gate.

7. The driving apparatus of claim 1, wherein the output circuit comprises a first MOSFET and a current-limiting resistor, the first MOSFET gate is configured for receiving the pulsed signal, the current-limiting resistor is provided between the first MOSFET source and ground, and the first MOSFET drain acts as an output terminal of the driving current.

8. A method for generating an adjustable driving current, comprising:

providing an adjustable analog signal by an analog input generating circuit, the analog input generating circuit being electrically connected between a first voltage source and ground;

converting the analog signal into a pulsed signal by an analog input driving circuit, the analog input driving circuit being electrically connected between a second voltage source and ground, wherein a pulse generation frequency of the pulsed signal can be adjusted via adjusting the analog signal, and the second voltage source comprises a rectifier, the rectifier being configured for converting an alternating current (AC) voltage into a direct current (DC) voltage, wherein the analog input generating circuit comprises a resistor $R_1$ and a variable resistor $R_{e1}$ together connected between the first voltage source and ground, the resistor $R_1$ is electrically connected to the variable resistor $R_{e1}$ together, in series, at a node, and the adjustable analog signal is supplied to the analog input driving circuit from the node; and converting the pulsed signal into a driving current as an output by an output circuit, wherein the driving current can be adjusted corresponding to the variation of frequency of the pulsed signal.

9. A driving apparatus configured for generating an adjustable driving current, comprising:

an analog input generating circuit;
an analog input driving circuit; and
an output circuit;

wherein the analog input generating circuit is electrically connected between a first voltage source and ground, and is configured for providing an adjustable analog signal;

the analog input driving circuit is electrically connected between a second voltage source and ground, and is configured for converting the analog signal into a pulsed signal, and comprises a voltage regulator, a sawtooth wave generating circuit, a clock signal generating circuit, and a signal converter; the sawtooth wave generating circuit is configured for generating a sawtooth wave signal; the clock signal generating circuit is configured for generating a clock signal; the voltage regulator is configured for converting a direct current (DC) voltage provided by the second voltage source into another DC voltage with a predetermined level and then providing the another DC voltage to the sawtooth wave generating circuit, the clock signal generating circuit and the signal converter; and the signal converter is configured for processing the sawtooth wave signal, the adjustable analog signal and the clock signal into the pulsed signal as an output; and the output circuit is configured for converting the pulsed signal into a driving current as an output, wherein the frequency of the pulsed signal can be adjusted via adjusting the analog signal and thereby varying the driving current.

10. The driving apparatus of claim 9, wherein the second voltage source comprises a rectifier, the rectifier being configured for converting an alternating current (AC) voltage into the DC voltage.

11. The driving apparatus of claim 10, wherein the rectifier is a full-wave rectifier.

12. The driving apparatus of claim 9, wherein the analog input generating circuit comprises a resistor $R_1$ and a variable resistor $R_{e1}$ together connected between the first voltage source and ground, the resistor $R_1$ is electrically connected with the variable resistor $R_{e1}$ together, in series, at a node, and the adjustable analog signal is supplied to the analog input driving circuit from the node.

13. The driving apparatus of claim 9, wherein the voltage regulator comprises a first metal oxide semiconductor field effect transistor (MOSFET), a second MOSFET, a first voltage-dividing resistor, a second voltage-dividing resistor, a feedback resistor, a comparator, a buffer, and an adjustable resistor; the first MOSFET and the second MOSFET being provided between the second voltage source and ground; the first voltage-dividing resistor and the second voltage-dividing resistor being electrically connected, in series, to a node formed between the first MOSFET source and the second MOSFET drain, and the node acting as an output terminal of the another DC voltage; the first MOSFET drain being configured to receive a DC voltage provided by the second voltage source; the second MOSFET source being connected to ground, and the second MOSFET gate being connected to an output terminal of the buffer; the comparator comprising a negative input terminal, a positive input terminal, and an output terminal, the positive input terminal being configured to receive a reference voltage, and the output terminal being connected to an input terminal of the buffer; one terminal of the feedback resistor being connected to the negative input terminal of the comparator, and the other terminal of the feedback resistor being connected to a node formed between the first voltage-dividing resistor and the second voltage-dividing resistor; and one terminal of the adjusting resistor being connected to the node formed between the first voltage-dividing resistor and the second voltage-dividing resistor, and the other terminal of the adjustable resistor being connected to ground.

14. The driving apparatus of claim 9, wherein the signal converter comprises a first level converter and a second level converter; the first level converter being configured to receive the adjustable analog signal and the sawtooth wave signal, and process the adjustable analog signal and the sawtooth wave signal into a pulse width modulation (PWM) wave signal; and the second level converter being configured to receive the PWM wave signal and the clock signal, and then process the PWM wave signal and the clock signal into the pulsed signal.

15. The driving apparatus of claim 14, wherein the first level converter is a comparison circuit, and the second level converter is a NAND gate.

16. The driving apparatus of claim 9, wherein the output circuit comprises a first MOSFET and a current-limiting resistor, the first MOSFET gate is configured for receiving the pulsed signal, the current-limiting resistor is provided between the first MOSFET source and ground, and the first MOSFET drain acts as an output terminal of the driving current.

* * * * *